United States Patent
Ohmi et al.

(10) Patent No.: US 8,535,494 B2
(45) Date of Patent: Sep. 17, 2013

(54) ROTARY MAGNET SPUTTERING APPARATUS

(75) Inventors: Tadahiro Ohmi, Sendai (JP); Tetsuya Goto, Sendai (JP); Takaaki Matsuoka, Tokyo (JP)

(73) Assignees: National University Corporation Tohoku University, Sendai-Shi (JP); Tokyo Electron Limited, Tokyo (JP)

( * ) Notice: Subject to any disclaimer, the term of this patent is extended or adjusted under 35 U.S.C. 154(b) by 457 days.

(21) Appl. No.: 12/920,480

(22) PCT Filed: Mar. 2, 2009

(86) PCT No.: PCT/JP2009/053815
§ 371 (c)(1),
(2), (4) Date: Sep. 1, 2010

(87) PCT Pub. No.: WO2009/110404
PCT Pub. Date: Sep. 11, 2009

(65) Prior Publication Data
US 2011/0000783 A1 Jan. 6, 2011

(30) Foreign Application Priority Data
Mar. 4, 2008 (JP) .................................. 2008-052936

(51) Int. Cl.
*C23C 14/00* (2006.01)
(52) U.S. Cl.
USPC ............ 204/298.11; 204/298.08; 204/298.19; 204/298.2; 118/723 E
(58) Field of Classification Search
USPC .................. 204/298.11, 192.1, 298.19, 298.2; 118/723 E
See application file for complete search history.

(56) References Cited

U.S. PATENT DOCUMENTS

| | | | | |
|---|---|---|---|---|
| 4,170,541 | A * | 10/1979 | Lamont, Jr. | 204/298.28 |
| 5,399,253 | A * | 3/1995 | Grunenfelder | 204/298.2 |
| 5,605,576 | A * | 2/1997 | Sasaki et al. | 118/723 E |
| 6,152,071 | A * | 11/2000 | Akiyama et al. | 118/723 VE |
| 6,726,804 | B2 * | 4/2004 | Wang et al. | 156/345.44 |
| 2004/0211665 | A1 * | 10/2004 | Yoon et al. | 204/298.01 |
| 2007/0175748 | A1 * | 8/2007 | Atamny et al. | 204/192.1 |

FOREIGN PATENT DOCUMENTS

| JP | 11-241160 A | 9/1999 |
|---|---|---|
| WO | 2007/043476 A1 | 4/2007 |

OTHER PUBLICATIONS

Chinese Office action for 200980107381.0 dated Sep. 28, 2011.
International Search Report for PCT/JP2009/053815 dated May 26, 2009.

* cited by examiner

*Primary Examiner* — John Brayton
(74) *Attorney, Agent, or Firm* — Pearne & Gordon LLP

(57) ABSTRACT

Provided is a rotary magnet sputtering apparatus which includes a plasma shielding member and an outer wall connected to the ground and which has a series resonant circuit and a parallel resonant circuit between the plasma shielding member and the outer wall. The series resonant circuit has a very low impedance only at its resonant frequency while the parallel resonant circuit has a very high impedance only at its resonant frequency. With this configuration, the impedance between substrate RF power and the plasma shielding member becomes very high so that it is possible to suppress the generation of plasma between a substrate 10 to be processed and the plasma shielding member. Further, since a series resonant circuit is provided between a target and the ground, the RF power is efficiently supplied only to a region where the substrate passes under the target, so that a self-bias voltage is generated.

6 Claims, 3 Drawing Sheets

ROTARY MAGNET SPUTTERING APPARATUS

TECHNICAL FIELD

This invention relates to a sputtering apparatus widely used in forming a film of metal or insulator and, in particular, relates to a sputtering apparatus using rotary magnets.

BACKGROUND ART

Sputtering apparatuses are widely used in the manufacture of optical disks, in the manufacture of electronic devices such as liquid crystal display elements and semiconductor elements, and further, in the formation of metal thin films and insulator thin films in general. In the sputtering apparatus, a raw material for thin film formation is used as a target, while plasma based on an argon gas or the like is caused to occur by supply of DC high voltage or high-frequency power. The target by the plasma caused to occur from gas is activated to be melted and scattered on a substrate to be processed to form a film on the substrate.

In a sputtering film forming method, a recent tendency has been predominantly directed to a film forming method that uses a magnetron sputtering apparatus which can raise the film forming rate. To this end, the magnetron sputtering apparatus is structured such that magnets are disposed on the back side of a target to generate the lines of magnetic force parallel to a target surface, thereby confining plasma to the target surface to obtain high-density plasma.

For the purpose of improving the target utilization efficiency to reduce the production cost and enabling stable long-term operation, the inventors have proposed a rotary magnet sputtering apparatus. This rotary magnet sputtering apparatus is structured such that a plurality of plate-like magnets are continuously disposed on a columnar rotary shaft and, by rotating them, a magnetic field pattern on a target surface moves with time. The rotary magnet sputtering is excellent not only in significant improvement of the utilization efficiency of a target material but also in prevention of charge-up damage and ion irradiation damage due to plasma (see Patent Document 1).

Patent Document 1: PCT International Publication No. WO2007/043476

DISCLOSURE OF THE INVENTION

Problem to be Solved by the Invention

Further, the rotary magnet sputtering apparatus described in Patent Document 1 has an advantage that it is possible to prevent local wear of the target and thus to use the target for a long time.

Presumably, in future, it will also be required to improve the density of a thin film to be formed by the rotary magnet sputtering apparatus and to improve the hole burying property thereof by allowing sputtering particles to reach the inside of fine holes.

Specifically, this invention aims to provide a rotary magnet sputtering apparatus which is capable of efficiently controlling the ion irradiation energy that reaches a substrate, thus making it possible to improve the density of a thin film to be formed by preventing the occurrence of contamination and charge-up damage and further to improve the hole burying property thereof by allowing sputtering particles to reach the inside of fine holes.

Means for Solving the Problem

By using a rotary magnet sputtering apparatus, the present inventors conducted experiments for increasing the ion irradiation energy of argon ions or the like generated in plasma. To this end, RF power was applied to a substrate to thereby generate a negative self-bias voltage on a substrate surface.

The experiments were conducted by the use of a rotary magnet sputtering apparatus which is similar to that described in Patent Document 1 and which specifically had a shielding member which was spaced apart from a target so as to cover end portions of the target and which was disposed on the opposite side with respect to helical plate-like magnet groups and electrically grounded. In the rotary magnet sputtering apparatus of this type, when RF power was applied to a substrate, an undesirable phenomenon was observed such that plasma was undesirably excited between the substrate and the shielding member disposed around the target. As a result, a phenomenon was observed in which atoms forming the shielding member adhered to the substrate and the substrate was unavoidably contaminated due to adhesion of the atoms to the substrate. Further, it became clear that charge-up damage caused by the undesirably excited plasma was also raised as a problem.

Based on the above-mentioned new knowledge the present inventors obtained about the rotary magnet sputtering apparatus, this invention aims to solve its problems.

According to a first aspect of this invention, there is provided a rotary magnet sputtering apparatus comprising a substrate placing stage for placing thereon a substrate to be processed, a member on which a target is to be placed so as to face the substrate, and a magnet disposed on a side opposite to the substrate placing stage with respect to a portion where the target is disposed, and configured to confine plasma on a target surface by forming a magnetic field on the target surface using the magnet, characterized in that the magnet comprises a rotary magnet group having a plurality of plate-like magnets continuously arranged on a columnar rotary shaft and a fixed outer peripheral member which is formed by a fixed magnet or a ferromagnetic member and which is arranged in parallel to the target surface around the rotary magnet group, the fixed magnet of the fixed outer peripheral member being magnetized in a direction perpendicular to the target surface or the ferromagnetic member of the fixed outer peripheral member being not magnetized in advance, the magnet being structured so that a magnetic field pattern on the target surface moves with time by rotating the rotary magnet group along with the columnar rotary shaft, the rotary magnet sputtering apparatus further comprising:
a shielding member disposed on an opposite side of the target with respect to the rotary magnet group so as to cover an end portion of the target and to be spaced apart from the target, the shielding member being provided with a slit which extends in the same direction as an axial direction of the columnar rotary shaft and opens the target to the substrate, wherein plasma is excited on the target surface by applying, to the target, at least one of a DC power, an RF power with a first frequency, and an RF power with a second frequency, and wherein the substrate placing stage is provided with an RF application electrode so as to cause a self-bias voltage on the substrate placing stage during a sputtering process by applying a substrate RF power to the RF application electrode.

According to a second aspect of this invention, there is provided a rotary magnet sputtering apparatus mentioned in the first aspect of this invention, characterized in that an impedance between the shielding member and the ground is 1 kΩ or more at a frequency of the substrate RF power while an impedance between the target and the ground is 10Ω or less at the frequency of the substrate RF power, and an impedance between the shielding member and the ground is 10Ω or less at the frequency or frequencies of the one or two RF powers which is/are applied to the target.

According to a third aspect of this invention, there is provided a rotary magnet sputtering apparatus according to the first aspect, characterized in that an impedance between the shielding member and the ground is 10 kΩ or more at a frequency of the substrate RF power while an impedance between the target and the ground is 1Ω or less at the frequency of the substrate RF power, and an impedance between the shielding member and the ground is 1Ω or less at the frequency or frequencies of the one or two RF powers which is/are applied to the target.

According to a fourth aspect of this invention, there is provided a rotary magnet sputtering apparatus according to any one of the first through the third aspects, characterized in that an LC parallel resonant circuit is provided between the shielding member and the ground and has a resonant frequency substantially equal to a frequency of the substrate RF power, and each frequency of the one or two RF powers applied to the target is selected except the resonant frequency and a frequency region of its half-width.

According to a fifth aspect of this invention, there is provided a rotary magnet sputtering apparatus according to any one of the first through the third aspects, characterized in that, between the shielding member and the ground, an LC parallel resonant circuit is provided such that a resonant frequency of the LC parallel resonant circuit is substantially equal to a frequency of the substrate RF power together with one or two LC series resonant circuits which has/have a resonant frequency or resonant frequencies substantially equal to the frequency or frequencies of the one or two plasma excitation powers which is/are applied to the target.

According to a sixth aspect of this invention, there is provided a sputtering apparatus comprising a substrate placing stage for placing thereon a substrate to be processed, a member on which a target is to be placed so as to face the substrate, and a magnet disposed on a side opposite to the substrate placing stage with respect to a portion where the target is disposed, and adapted to confine plasma on a target surface by forming a magnetic field on the target surface using the magnet, characterized in that the substrate placing stage is movable to change its position relative to the target and is provided with an RF application electrode so as to cause a self-bias voltage on the substrate placing stage during a sputtering process by applying a substrate RF power to the RF application electrode.

According to a seventh aspect of this invention, there is provided a sputtering apparatus according to the sixth aspect, characterized by comprising a shielding member disposed on an opposite side of the target with respect to the magnet so as to cover an end portion of the target and to be spaced apart from the target, wherein the shielding member is provided with a slit exposing the target to the substrate.

According to an eighth aspect of this invention, there is provided a sputtering apparatus according to the sixth or the seventh aspect, characterized in that plasma is excited on the target surface by applying, to the target, at least one of a DC power, an RF power with a first frequency, and an RF power with a second frequency.

According to a ninth aspect of this invention, there is provided a sputtering apparatus according to the seventh or the eighth aspects, characterized in that the shielding member is grounded with respect to a d.c. current.

According to a tenth aspect of this invention, there is provided a sputtering apparatus according to any one of the seventh to the ninth aspects, characterized in that the target is given at least one of an RF power with a first frequency and an RF power with a second frequency and the shielding member is substantially grounded with respect to the frequency or frequencies of the one or two RF powers given to the target.

According to an eleventh aspect of this invention, there is provided a sputtering apparatus according to any one of the seventh to the tenth aspects, characterized in that the shielding member is substantially insulated with respect to a frequency of the substrate RF power.

According to a twelfth aspect of this invention, there is provided a sputtering method by for use in forming a material of the target into a film on a substrate to be processed, by using the sputtering apparatus according to any one of the first to the eleventh aspects.

According to a thirteenth aspect of this invention, there is provided an electronic device manufacturing method characterized by comprising performing sputtering film formation on a substrate to be processed, by using the sputtering method according to the twelfth aspect.

Effect of the Invention

According to this invention, in a rotary magnet sputtering apparatus, it is possible to efficiently control the ion irradiation energy of argon ions or the like that reach a substrate. This makes it possible to improve the density of a thin film to be formed by preventing the occurrence of contamination and charge-up damage and further to improve the hole burying property thereof by allowing sputtering particles to reach the inside of fine holes.

Figure 1:
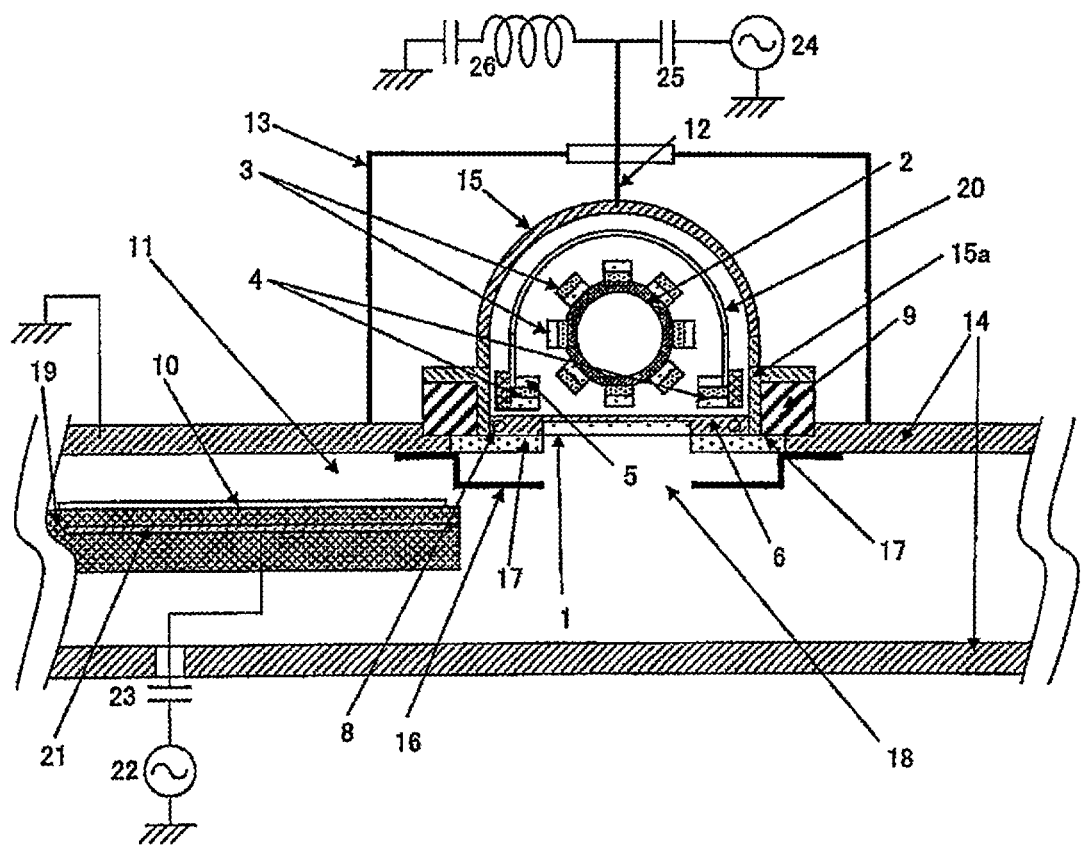
FIG. 1 is a schematic structural diagram showing a rotary magnet sputtering apparatus according to an embodiment of this invention.

DESCRIPTION OF SYMBOLS 1 target
2 columnar rotary shaft
3 helical plate-like magnet group
4 fixed outer peripheral plate-like magnet
5 outer peripheral paramagnetic member
6 backing plate
7 coolant passage
8 insulating member
9 substrate to be processed
10 process chamber space
11 feeder line
12 cover
13 outer wall
14 paramagnetic metal conductor
15 plasma shielding member
16 insulating member
17 slit
18 placing stage 19 magnetic member
20 substrate RF electrode
21 RF power supply
22 blocking capacitor
23 first RF power supply
24 blocking capacitor
25 series resonant circuit
26 first series resonant circuit
27 second series resonant circuit

BEST MODE FOR CARRYING OUT THE
INVENTION

Hereinbelow, an embodiment of this invention will be described with reference to the drawings.

FIG. 1 is a sectional view for explaining the structure of a rotary magnet sputtering apparatus according to the embodiment of this invention.

In FIG. 1, 1 denotes a target, 2 a columnar rotary shaft, 3 a plurality of helical plate-like magnet groups helically disposed on a surface of the columnar rotary shaft 2, 4 a fixed outer peripheral plate-like magnet disposed around the helical plate-like magnet groups 3, 5 an outer peripheral paramagnetic member disposed on the side opposite to the target and facing the fixed outer peripheral plate-like magnet 4, 6 a backing plate (an electric conductor with excellent heat conduction, for example, made of copper) to which the target 1 is bonded, 15 a paramagnetic metal conductor (for example, made of stainless or Al, but its skirt portion 15a is, for example, made of copper with excellent heat conduction) configured to cover the columnar rotary shaft 2 and the helical plate-like magnet groups 3 at portions thereof other than on the target 1 side, 8 a passage for passing a coolant therethrough, 9 an insulating member (for example, made of quartz), 10 a substrate to be processed, 19 a placing stage (movable in left and right directions in the figure) for placing a substrate to be processed thereon, 11 a process chamber space, 12 a feeder line, 13 a metal cover electrically connected to a process chamber, 14 outer walls (for example, made of aluminum or aluminum alloy) forming the process chamber, 16 a plasma shielding member made of metal, 17 an insulating member excellent in plasma resistance, 18 a slit formed in the plasma shielding member 16, and 20 a magnetic member (for example, made of iron (STCC)) for forming a magnetic circuit to form a strong magnetic field on the target 1.

Hereinbelow, a description will be given about an example where the fixed outer peripheral plate-like magnet 4 magnetized perpendicularly to a surface of the target 1 is disposed around the plurality of helical plate-like magnet groups 3. However, the fixed outer peripheral plate-like magnet 4 may be replaced by a ferromagnetic member which is not magnetized in advance. That is, a fixed outer peripheral member in the form of a magnet or a ferromagnetic member not magnetized in advance is required to be disposed around the plurality of helical plate-like magnet groups 3.

24 denotes a first RF power supply for plasma excitation and 25 a blocking capacitor. Although not illustrated, the blocking capacitor 25 may include a capacitor and an inductor to form a matching circuit. The power frequency of the power supply 24 is 40 MHz. Further, although not illustrated, a second RF power supply is connected to the feeder line 12 in parallel to the power supply 24 through a blocking capacitor and a matching circuit in the same manner. The power frequency of the second RF power supply is 2 MHz. The frequency of the first RF power supply 24 is set to the relatively high value of 40 MHz, thereby contributing to an increase in density and a reduction in electron temperature of plasma to be excited on the target surface. In particular, when the plasma increases in density, the ion irradiation dose on the substrate 10 is improved, thus leading to an improvement in film quality.

The power frequency of the second RF power supply is set to the relatively low value of 2 MHz. By applying the power from the second RF power supply, a large negative self-bias voltage is caused to occur on the target during plasma excitation. This leads to an improvement in film forming rate. By the use of such dual frequency excitation plasma, the film quality and the film forming rate can be controlled quite easily. Such a system is very effective when using an insulator target. When the target is conductive, a DC power supply may be connected to the feeder line 12 in parallel instead of the second RF power supply, thereby controlling the self-bias voltage of the target by the DC power supply. In this embodiment, the power frequency of the first RF power supply is set to 40 MHz and that of the second RF power supply is set to 2 MHz, but the frequencies are not limited thereto and may be properly changed depending on a desired plasma density and film forming rate.

21 denotes a substrate RF electrode embedded in the placing stage 19, 22 an RF power supply for supplying RF power to the substrate RF electrode 21, and 23 a blocking capacitor. Although not illustrated, the blocking capacitor 23 includes a capacitor and an inductor to form a matching circuit. The power frequency of the RF power supply 22 is 400 kHz. The same frequency as that of the power for use in plasma excitation may be used as the frequency of the RF power supply 22. In this case, in order to prevent interference of the power frequency of the RF power supply 22 with the plasma excitation power, the power frequency is preferably phase-shifted from that of the plasma excitation power. And in this case, a later-described series resonant circuit 26 becomes unnecessary.

26 is an LC series resonant circuit which is provided between the feeder line 12 and the ground. This series resonant circuit comprises an inductor with inductance L1 and a capacitor with capacitance C1 and has a resonant frequency f1 (see equation below) set equal to the substrate RF power frequency.

[Numerical Formula 1]

$$f1 = 1/(2\pi\sqrt{L1C1})$$ Equation 1

The paramagnetic member 15 has an effect of magnetic shielding of a magnetic field generated by the magnets disposed inside the paramagnetic member 15 and an effect of reducing a change in magnetic field due to disturbance near the target.

Figure 2:
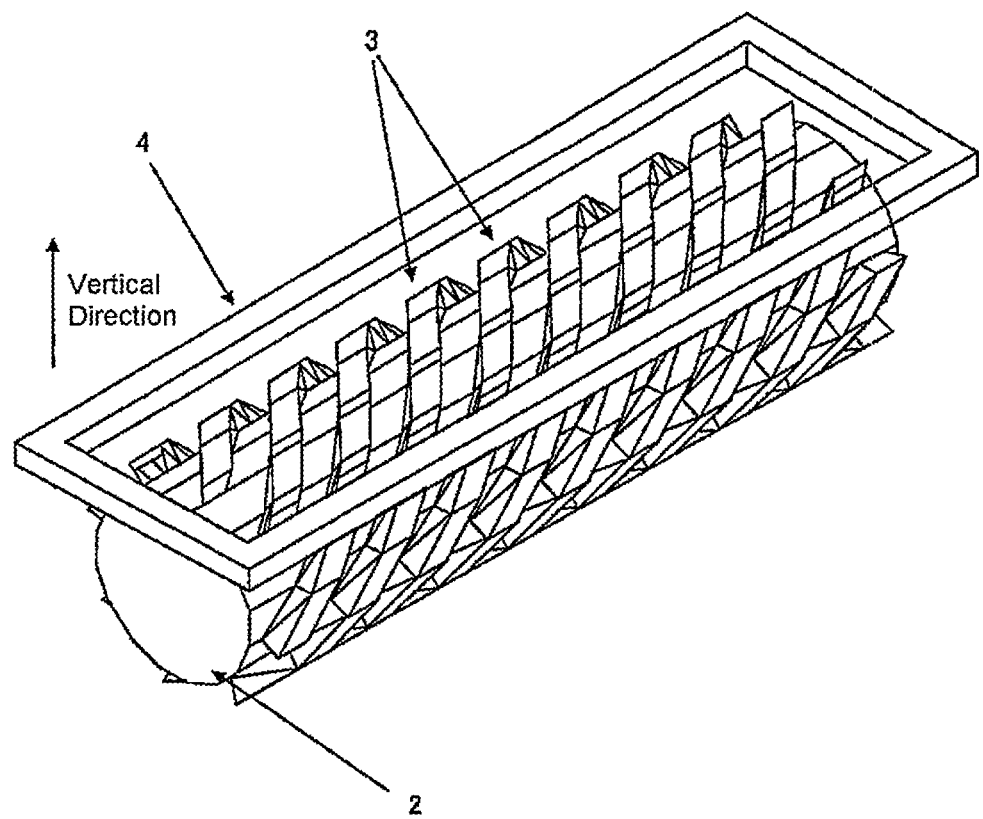
FIG. 2 is a perspective view for explaining in more detail a magnet portion of the rotary magnet sputtering apparatus shown in FIG. 1.

In order to explain a magnet portion in more detail, FIG. 2 shows a perspective view of the columnar rotary shaft 2, the plurality of helical plate-like magnet groups 3, and the fixed outer peripheral plate-like magnet 4. Herein, the plurality of helical plate-like magnet groups 3 form a rotary magnet group that rotates along with the rotation of the columnar rotary shaft 2.

A material of the columnar rotary shaft 2 may be an ordinary stainless steel or the like, but it is preferable that the columnar rotary shaft 2 be partly or entirely made of a paramagnetic substance with a low magnetic resistance such as, for example, a Ni—Fe-based high magnetic permeability alloy. In this embodiment, the columnar rotary shaft 2 is made of the Ni—Fe-based high magnetic permeability alloy. The columnar rotary shaft 2 can be rotated by a non-illustrated gear unit and motor.

The columnar rotary shaft 2 has a regular hexadecagonal cross-section with one side having a length of 16.7 mm. Many rhombic plate-like magnets are attached to respective faces to form the plurality of helical plate-like magnet groups 3.

The columnar rotary shaft 2 is configured so as to be attached with the magnets on its outer periphery, can be easily made thick, and has a structure that is strong against bending deformation due to magnetic forces applied by the magnets. In order to stably generate a strong magnetic field, each of the plate-like magnets forming the helical plate-like magnet groups 3 is preferably a magnet with a high residual magnetic flux density, a high coercive force, and a high maximum energy product, such as, for example, a Sm—Co-based sintered magnet with a residual magnetic flux density of about 1.1 T or a Nd—Fe—B-based sintered magnet with a residual magnetic flux density of about 1.3 T. In this embodiment, the Nd—Fe—B-based sintered magnet is used. The plate-like magnets of the helical plate-like magnet groups 3 are each magnetized in a direction perpendicular to its plate surface and are helically bonded to the columnar rotary shaft 2 to form a plurality of helices such that the helices adjacent to each other in an axial direction of the columnar rotary shaft form mutually different magnetic poles, i.e. N-poles and S-poles, on the outer side in a diameter direction of the columnar rotary shaft. It is to be noted that ferromagnetic members without any given polarity may be provided instead of either the N-poles or the S-poles.

When the fixed outer peripheral plate-like magnet 4 is seen from the target 1, it has a structure which surrounds the rotary magnet group composed of the helical plate-like magnet groups 3. In addition, the illustrated fixed outer peripheral plate-like magnet 4 is magnetized so that the target 1 side thereof becomes an S-pole. A Nd—Fe—B-based sintered magnet is used also as the fixed outer peripheral plate-like magnet 4 for the same reason as for the plate-like magnets of the helical plate-like magnet groups 3. It is to be noted that an N-pole may be directed towards the target 1 instead of the S-pole and that a ferromagnetic member without any given polarity may be used as the fixed outer peripheral plate-like magnet.

Figure 3:
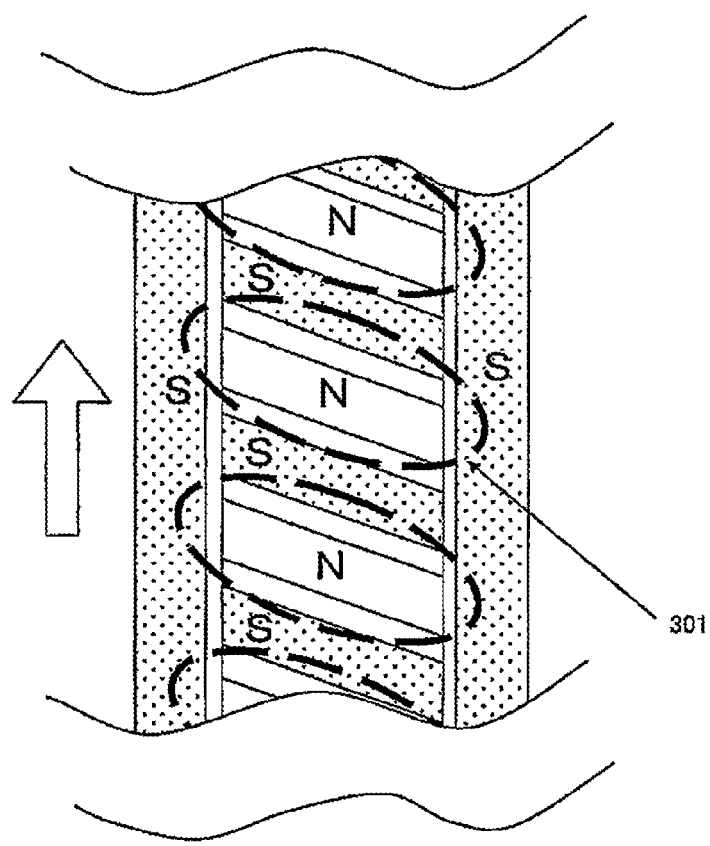
FIG. 3 is a diagram for explaining plasma loop formation in this invention.

Next, referring to FIG. 3, a description will be given in detail about plasma loop formation in this embodiment. As described above with reference to FIG. 2, the helical plate-like magnet groups 3 are formed by disposing the many plate-like magnets on the columnar rotary shaft 2. In this case, when the helical plate-like magnet groups 3 are seen from the target side, an arrangement is given such that the N-poles of the plate-like magnets are approximately surrounded by the S-poles of the plate-like magnets disposed on both sides of the N-pole plate-like magnets and the S-pole of the fixed outer peripheral plate-like magnet 4. FIG. 3 is a conceptual diagram thereof. With this configuration, the lines of magnetic force generated from the N-poles of the plate-like magnets are terminated at the peripheral S-poles. As a result, many closed plasma loop regions 301 are formed on the target surface located at some distance from surfaces of the plate-like magnets. Further, by rotating the columnar rotary shaft 2, the many plasma loop regions 301 move along with the rotation. In FIG. 3, the plasma loop regions 301 move in a direction indicated by an arrow. Accordingly, the entire target surface is uniformly scanned by the plasma loop regions 301. At end portions of the plate-like magnets, the plasma loop regions 301 sequentially appears from one of the end portions and sequentially disappears at the other end portion.

Even in the case where a ferromagnetic member/ferromagnetic members without any polarity may be arranged instead of either or both of the S-pole helical plate-like magnet groups and the S-pole fixed outer peripheral plate-like magnet, since the lines of magnetic force generated from the N-poles of the plate-like magnets are terminated at the peripheral ferromagnetic member/members, the same operation can be performed.

The placing stage 19 to which the substrate 10 is attached has a moving mechanism adapted to pass under the target 1 and thus causes the substrate 10 to move right under the slit 18 shown in FIG. 1 while plasma is excited on the target surface, thereby allowing film formation to be carried out right under the slit 18.

Figure 4:
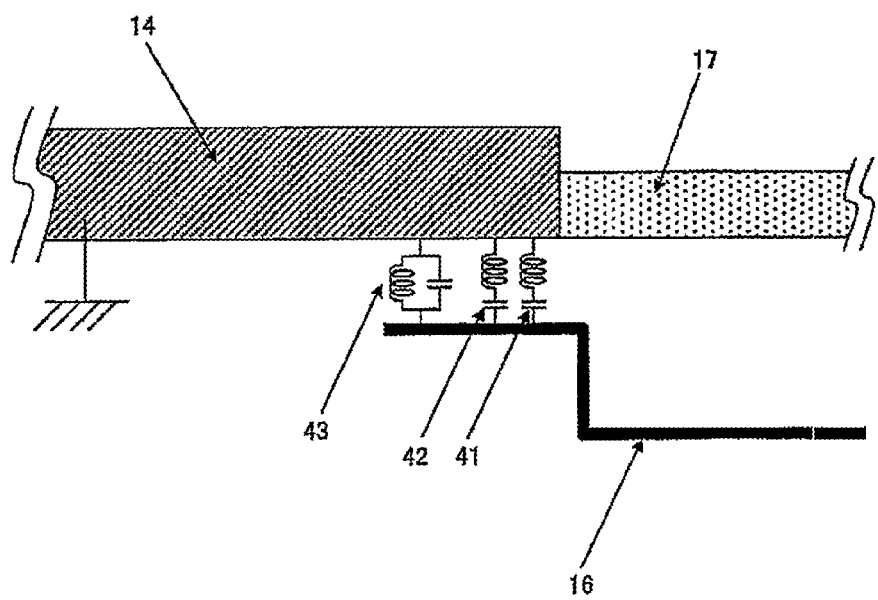
FIG. 4 is an enlarged view of the vicinity of a plasma shielding member 16 in FIG. 1.

Next, the plasma shielding member 16 in FIG. 1 will be described in detail with reference to FIG. 4. A first series resonant circuit 41, a second series resonant circuit 42, and a parallel resonant circuit 43 are provided between the plasma shielding member 16 and the metal outer wall 14 which is connected to the ground and which serves as a part of the process chamber. By adjusting the inductance and capacitance, both the resonant frequencies of the first series resonant circuit 41 and the second series resonant circuit 42 are set to 40 MHz and 2 MHz which are equal to the power frequency of the first plasma excitation power and the power frequency of the second plasma excitation power, respectively. The parallel resonant circuit 43 comprises an inductor with inductance L2 and a capacitor with capacitance C2 and has a resonant frequency f2 (see equation below) is set to the frequency 400 kHz of the substrate RF power.

[Numerical Formula 2]

$$[f2 = 1/(2\pi\sqrt{L2C2})] \qquad \text{Equation 2}$$

A series resonant circuit has a very low impedance only at the resonant frequency and thus serves as a bandpass filter. In this embodiment, the impedance between the plasma shielding member 16 and the ground is set to 1Ω or less. On the other hand, a parallel resonant circuit has a very high impedance only at the resonant frequency and low impedances in other frequency bands. In this embodiment, the impedance is set to 10 kΩ or more at the resonant frequency. With this configuration, the substrate RF power is applied during movement of the substrate 10 to carry out film formation thereon. During movement, the substrate 10 passes under the plasma shielding member 16. In this event, since the impedance between the substrate RF power and the shielding member 16 is very high, it is possible to suppress the generation of plasma between the substrate 10 and the plasma shielding member 16.

The series resonant circuit 26 is provided between the target 1 and the ground and thus the impedance at the frequency of the substrate RF power is set to 1Ω or less. Accordingly, the RF power is efficiently supplied only to a region where the substrate 10 passes under the target 1, so that a self-bias voltage is generated. This makes it possible to control the ion irradiation energy by adjusting the substrate RF power and thus to form a film which is excellent in hole burying property and dense. Further, the impedance between the plasma shielding member 16 and the target 1 is very low at the power frequencies applied to the target 1 for plasma excitation because the series resonant circuits corresponding to those respective frequencies are provided. Therefore, the plasma shielding member 16 serves as a ground plane. Thus, it is possible to excite plasma efficiently and stably. Even if there are no series resonant circuits corresponding to such respective frequencies, as long as the power frequencies for use in plasma excitation differ from the resonant frequency of the above-mentioned parallel resonant circuit and its half-width region, the parallel resonant circuit also serves as a ground plane. Therefore, even if there are no series resonant circuits, the plasma shielding member 16 serves as a ground plane to thereby enable efficient plasma excitation.

Since the plasma shielding member 16 is connected to the outer wall 14 through the inductor of the parallel resonant circuit 43 so as to be grounded in terms of direct current, a DC bias is also enabled and, therefore, plasma excitation by a DC power supply is also enabled. When the DC power supply is not used, the plasma shielding member 16 may be insulated from the outer wall 14 with respect to d.c. current.

The substrate RF electrode 21 for supplying the RF power to the substrate 10 is embedded in the placing stage 19 made of ceramic. Instead, a ceramic plate may be placed on a placing stage made of metal (for example, made of aluminum alloy or stainless) and the substrate RF electrode 21 may be embedded in the ceramic plate. In this case, the substrate 10 is placed on the ceramic plate and the electrode is insulated from the substrate 10 and the metal placing stage with respect to the d.c. current. Alumina or aluminum nitride, for example, is used as the ceramic while a heat-resistant metal material such as Mo is used as the electrode.

While this invention has been described in connection with the embodiment, the structures of the magnets, various power frequencies, and so on are not limited to the embodiment. In particular, the fixed outer peripheral plate-like magnet 4 and/or either of the helical plate-like magnet groups may be formed by a ferromagnetic member/ferromagnetic members not magnetized.

INDUSTRIAL APPLICABILITY

A magnetron sputtering apparatus according to this invention can be not only used for forming an insulating film or a conductive film on a semiconductor wafer or the like, but also applied for forming various films on a substrate such as a glass substrate of a flat panel display device, and can be used for sputtering film formation in the manufacture of storage devices, magnetic recording devices, or other electronic devices, or further, in the formation of metal thin films, insulator thin films, or the like in general.

What is claimed is:

1. A rotary magnet sputtering apparatus comprising a substrate placing stage for placing thereon a substrate to be processed, a member on which a target is to be placed so as to face said substrate, and a magnet disposed on a side opposite to said substrate placing stage with respect to a portion where said target is disposed, and configured to confine plasma on a target surface by forming a magnetic field on the target surface using said magnet, wherein:

said magnet comprises:
a rotary magnet group having a plurality of plate-shaped magnets continuously arranged on a columnar rotary shaft and a fixed outer peripheral member which is formed by a fixed magnet or a ferromagnetic member and which is arranged in parallel to the target surface around said rotary magnet group;
said fixed magnet of the fixed outer peripheral member being magnetized in a direction perpendicular to the target surface or said ferromagnetic member of the fixed outer peripheral member being not magnetized in advance;
the magnet being structured so that a magnetic field pattern on the target surface moves with time by rotating said rotary magnet group along with said columnar rotary shaft,
said rotary magnet sputtering apparatus further comprising:
a shielding member disposed on an opposite side of said target with respect to said rotary magnet group so as to cover an end portion of said target and to be spaced apart from said target, said shielding member being provided with a slit which extends in the same direction as an axial direction of said columnar rotary shaft and opens said target to said substrate, wherein:
plasma is excited on the target surface by applying, to said target, at least one of an RF power with a first frequency, and an RF power with a second frequency, and wherein:
said substrate placing stage is provided with an RF application electrode so as to cause a self-bias voltage on said substrate placing stage during a sputtering process by applying a substrate RF power to said RF application electrode;

wherein:
an impedance between said shielding member and the ground is 1 kΩ or more at a frequency of said substrate RF power while an impedance between said target and the ground is 10Ω or less at the frequency of said substrate RF power, and an impedance between said shielding member and the ground is 10Ω or less at the frequency or frequencies of said one or two RF powers which is/are applied to said target.

2. A rotary magnet sputtering apparatus comprising a substrate placing stage for placing thereon a substrate to be processed, a member on which a target is to be placed so as to face said substrate, and a magnet disposed on a side opposite to said substrate placing stage with respect to a portion where said target is disposed, and configured to confine plasma on a target surface by forming a magnetic field on the target surface using said magnet, wherein:

said magnet comprises:
a rotary magnet group having a plurality of plate-shaped magnets continuously arranged on a columnar rotary shaft and a fixed outer peripheral member which is formed by a fixed magnet or a ferromagnetic member and which is arranged in parallel to the target surface around said rotary magnet group;
said fixed magnet of the fixed outer peripheral member being magnetized in a direction perpendicular to the target surface or said ferromagnetic member of the fixed outer peripheral member being not magnetized in advance;
the magnet being structured so that a magnetic field pattern on the target surface moves with time by rotating said rotary magnet group along with said columnar rotary shaft,
said rotary magnet sputtering apparatus further comprising:
a shielding member disposed on an opposite side of said target with respect to said rotary magnet group so as to cover an end portion of said target and to be spaced apart from said target, said shielding member being provided with a slit which extends in the same direction as an axial direction of said columnar rotary shaft and opens said target to said substrate, wherein:
plasma is excited on the target surface by applying, to said target, at least one of an RF power with a first frequency, and an RF power with a second frequency, and wherein:
said substrate placing stage is provided with an RF application electrode so as to cause a self-bias voltage on said substrate placing stage during a sputtering process by applying a substrate RF power to said RF application electrode;

wherein:

an impedance between said shielding member and the ground is 10 kΩ or more at a frequency of said substrate RF power while an impedance between said target and the ground is 1Ω or less at the frequency of said substrate RF power, and an impedance between said shielding member and the ground is 1Ω or less at the frequency or frequencies of said one or two RF powers which is/are applied to said target.

3. A rotary magnet sputtering apparatus comprising a substrate placing stage for placing thereon a substrate to be processed, a member on which a target is to be placed so as to face said substrate, and a magnet disposed on a side opposite to said substrate placing stage with respect to a portion where said target is disposed, and configured to confine plasma on a target surface by forming a magnetic field on the target surface using said magnet, wherein:

said magnet comprises:

a rotary magnet group having a plurality of plate-shaped magnets continuously arranged on a columnar rotary shaft and a fixed outer peripheral member which is formed by a fixed magnet or a ferromagnetic member and which is arranged in parallel to the target surface around said rotary magnet group;

said fixed magnet of the fixed outer peripheral member being magnetized in a direction perpendicular to the target surface or said ferromagnetic member of the fixed outer peripheral member being not magnetized in advance;

the magnet being structured so that a magnetic field pattern on the target surface moves with time by rotating said rotary magnet group along with said columnar rotary shaft, said rotary magnet sputtering apparatus further comprising:

a shielding member disposed on an opposite side of said target with respect to said rotary magnet group so as to cover an end portion of said target and to be spaced apart from said target, said shielding member being provided with a slit which extends in the same direction as an axial direction of said columnar rotary shaft and opens said target to said substrate, wherein:

plasma is excited on the target surface by applying, to said target, at least one of an RF power with a first frequency, and an RF power with a second frequency, and wherein:

said substrate placing stage is provided with an RF application electrode so as to cause a self-bias voltage on said substrate placing stage during a sputtering process by applying a substrate RF power to said RF application electrode;

wherein, between said shielding member and the ground, an LC parallel resonant circuit is provided such that a resonant frequency of said LC parallel resonant circuit is substantially equal to a frequency of said substrate RF power, together with one or two LC series resonant circuits which has/have a resonant frequency or resonant frequencies substantially equal to the frequency or frequencies of said one or two plasma excitation powers which is/are applied to said target.

4. A rotary magnet sputtering apparatus according to claim 1, wherein applying to said target in addition to the RF power with the first or second frequency a DC power.

5. A rotary magnet sputtering apparatus according to claim 2, wherein applying to said target in addition to the RF power with the first or second frequency a DC power.

6. A rotary magnet sputtering apparatus according to claim 3, wherein applying to said target in addition to the RF power with the first or second frequency a DC power.

* * * * *

UNITED STATES PATENT AND TRADEMARK OFFICE
CERTIFICATE OF CORRECTION

PATENT NO. : 8,535,494 B2  
APPLICATION NO. : 12/920480  
DATED : September 17, 2013  
INVENTOR(S) : Tadahiro Ohmi et al.

Page 1 of 1

It is certified that error appears in the above-identified patent and that said Letters Patent is hereby corrected as shown below:

In the specification, column 4, lines 55-67, and column 5, lines 1-9, please replace the current list with this amended list
--1 target
2 columnar rotary shaft
3 helical plate-like magnet group
4 fixed outer peripheral plate-like magnet
5 outer peripheral paramagnetic member
6 backing plate
8 coolant passage
9 insulating member
10 substrate to be processed
11 process chamber space
12 feeder line
13 cover
14 outer wall
15 paramagnetic metal conductor
16 plasma shielding member
17 insulating member
18 slit
19 placing stage
20 magnetic member
21 substrate RF electrode
22 RF power supply
23 blocking capacitor
24 first RF power supply
25 blocking capacitor
26 series resonant circuit
41 first series resonant circuit
42 second series resonant circuit--

Signed and Sealed this  
Twenty-fourth Day of December, 2013

Margaret A. Focarino  
*Commissioner for Patents of the United States Patent and Trademark Office*